United States Patent [19]

Pan et al.

[11] Patent Number: 5,041,519

[45] Date of Patent: Aug. 20, 1991

[54] COMPOSITION COMPRISING EPOXY RESIN, BISMALEIMIDE AND BARBITURIC ACID

[75] Inventors: Jing-Pin Pan; Ker-Ming Chen, both of Hsin Chu Hsien, Taiwan

[73] Assignee: Industrial Technology Research Institute, Taiwan, Taiwan

[21] Appl. No.: 281,069

[22] Filed: Dec. 8, 1988

[51] Int. Cl.$^5$ .................... C08G 59/14; C08L 63/10
[52] U.S. Cl. ................... 528/114; 528/170; 528/322; 528/102
[58] Field of Search .............. 525/422, 423; 528/114, 528/170, 322, 102

[56] References Cited

U.S. PATENT DOCUMENTS

| | | | |
|---|---|---|---|
| 4,107,153 | 8/1978 | Akiyama et al. | 525/530 |
| 4,294,877 | 10/1981 | Graham | 525/527 |
| 4,401,777 | 8/1983 | Tsuboi et al. | 525/422 |
| 4,539,392 | 9/1985 | Kadoi et al. | 528/322 |

*Primary Examiner*—John C. Bleutge
*Assistant Examiner*—Robert E. L. Sellers, II
*Attorney, Agent, or Firm*—Cushman, Darby & Cushman

[57] ABSTRACT

This invention relates to a resin composition which is used for the production of printed circuit boards. The feature of said resin composition is to add barbituric acid or its derivatives to a bismaleimide resin, and mixed in a solvent or solvent system. The mixture is then added with epoxy resin and suitable amount of curing agent to form the required resin composition. The resin composition has high glass transition temperature and good toughness and other physical and electrical properties. Meanwhile, it would not cause phase separation, so is a high-performance material for the production of printed circuit boards.

5 Claims, 1 Drawing Sheet

COMPOSITION COMPRISING EPOXY RESIN, BISMALEIMIDE AND BARBITURIC ACID

BACKGROUND OF THE INVENTION

This invention relates to a high-performance resin composition for the production of printed circuit boards.

Circuit boards are widely used in electronic industries, such as the production of radio, TV sets, TV games, personal computers, various kinds of recorders and some other electronic apparatus. The production of circuit boards is firstly to impregnate a woven fiberglass sheet with resin, and then laminate copper sheet to one or both sides of the resin treated fiberglass sheet via a pressing process, and finally etch electrical circuit into the copper layer. Electrical connections are usually soldered to the board when the board is used.

Polymide resins are usually adopted to impregnate the fiberglass sheets to form high-quality circuit boards which have good thermal resistance, low thermal expansion coefficient and good electrical properties including high resistivity. However, in comparison with the epoxy-made circuit boards, such polyimide boards are relatively too expensive. Nevertheless, the circuit boards made from epoxy resin impregnated fiberglass sheets are relatively poor in thermal resistance, dimensional stability and electrical properties.

Therefore, there is a need for a high-performance composition which is cost competitive to epoxy resin and has physical and electrical properties close to polyimide resin. Previously, many patents and reports were disclosed concerning the improvement of epoxy resin or polyimide resin for the production of printed circuit boards. Some important patents of this subject include U.S. Pat. Nos. 4,529,790, 4,559,395, 4,594,921, 2,947,726, 2,971,942, 2,809,942 and 4,294,877. An effective improvement for this purpose is to adopt a difunctional epoxy resin, however, the glass transition temperature (Tg) of it is not high enough to suit the high production temperature. In the production of printed circuit boards, generally, one important requirement is that the glass transition temperature should be higher than 180° C., otherwise, distortion will occur during high-temperature operation.

To eliminate the drawback of conventional difunctional epoxy resin, a method as disclosed in U.S. Pat. No. 4,294,877 was to add bismaleimide (BMI) in the epoxy resin to increase the glass transition temperature. However, though the addition of bismaleimide would improve the heat resistance of epoxy resin, it would also cause the resultant printed circuit boards to become very brittle. The brittleness of the bismaleimide modified epoxy resin composition would result in much scrap when the cured product is drilled. In order to improve the brittleness, some suitable rubbers have been reported to be added in the resin system. However, the addition of rubber would unavoidably result in phase separation which would destroy the physical properties of circuit boards.

SUMMARY OF THE INVENTION

In view of the conventional resins being unable to produce high-quality circuit boards owing to the drawbacks as described above, the inventors hence through careful studies and repeated experiments developed a new resin composition which has high Tg value and better toughness. In other words, the novel resin composition of this invention has all the good properties desirable for printed circuit board production.

The prime object of this invention is to provide a resin composition for the production of printed circuit boards. The feature of this novel invention is to add barbituric acid (BTA) or its derivatives to bismaleimide (BMI) resins prior to the addition of epoxy resin. In more detailed description, the barbituric acid or its derivative is mixed with bismaleimide resin first, the mixture is then dissolved in a suitable solvent or solvent system, and finally mixed with epoxy resin and curing agents to form a perfect resin composition.

The resultant resin composition of this invention does not have phase separation problem. Besides, it has high glass transition temperature (Tg), good thermal resistance, good toughness and other desirable mechanical and physical properties.

In addition to the characteristics as described above, this invention still has an advantage that the resin composition according to this invention may be used to make partially-cured prepreg directly, which in the conventional process, it is necessary to add monofluoride monoethylamine complex as catalyst to produce the prepreg.

DETAILED DESCRIPTION OF THE INVENTION

Figure 1:
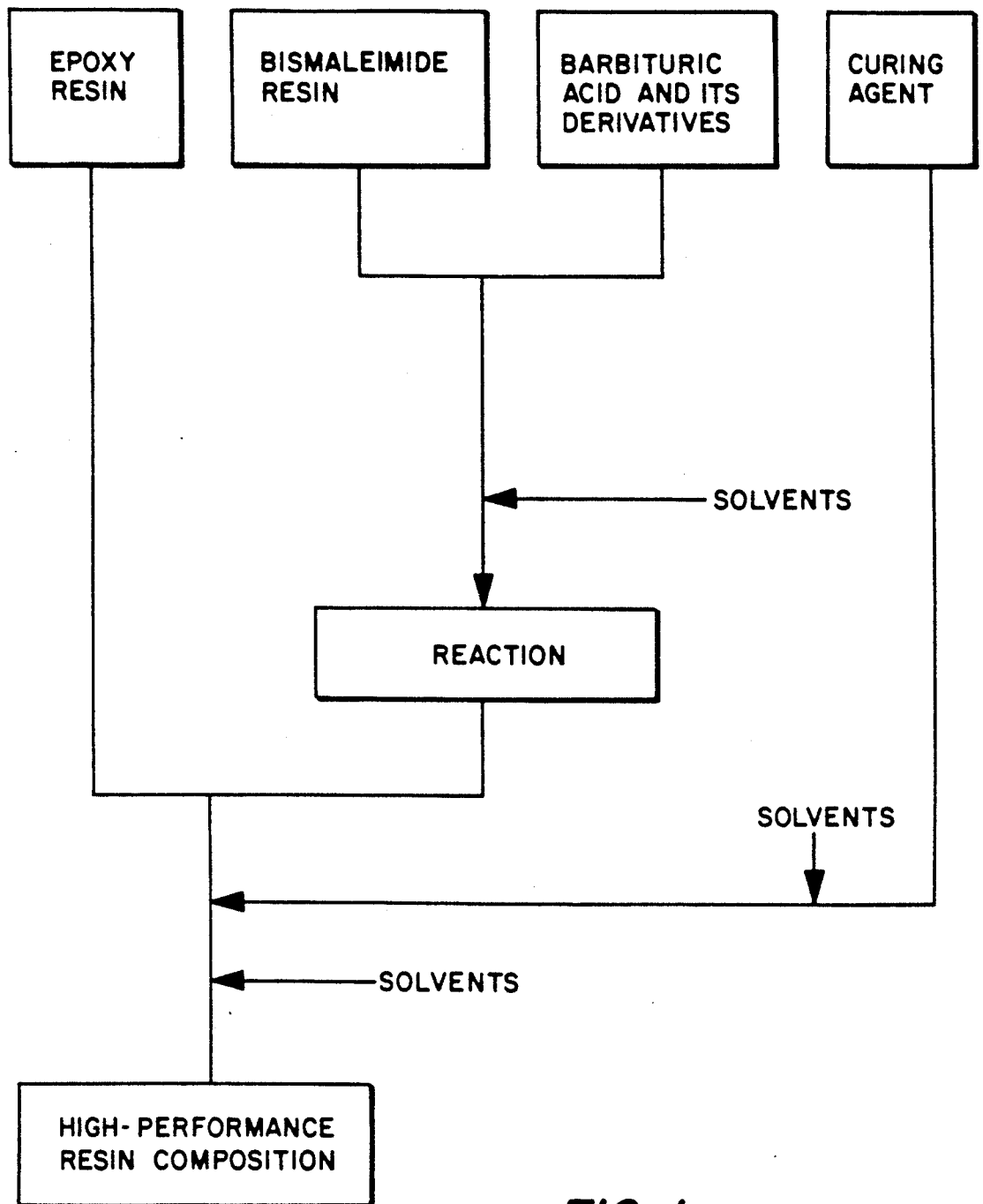
FIG. 1 illustrates a flow-diagram for the preparation of resin composition according to this invention.

The main characteristics of this invention are to prepare a resin composition which may be used for the production of printed circuit boards with high thermal resistance, high toughness and good mechanical and electrical properties.

The components of this invention comprise: (1) epoxy resin, (2) bismaleimide (BMI) resin, (3) barbituric acid (BTA) or its derivatives, and (4) curing agent. The components are further described as follows:

(1) The epoxy resin of this invention may come from one of the following structural formulas:

(i) An epoxy resin of the formula:

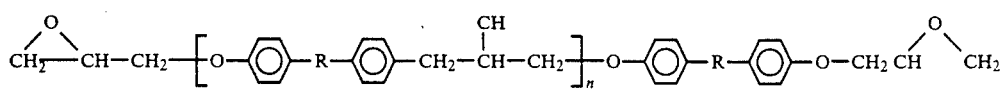

wherein
R: an alkyl group with 1-4 carbon atoms
n: positive integer
The equivalent weight of the epoxy is 150-1000.
(ii) An epoxy resin of the formula:

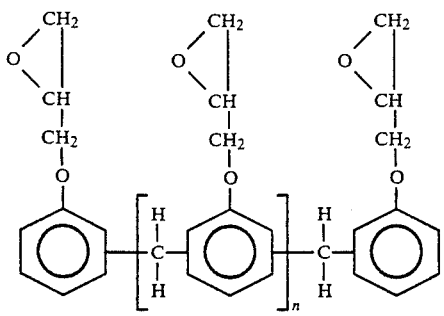

Wherein n is a positive integer, and the equivalent weight of the epoxy is 150-300.

(iii) An epoxy resin of the formula:

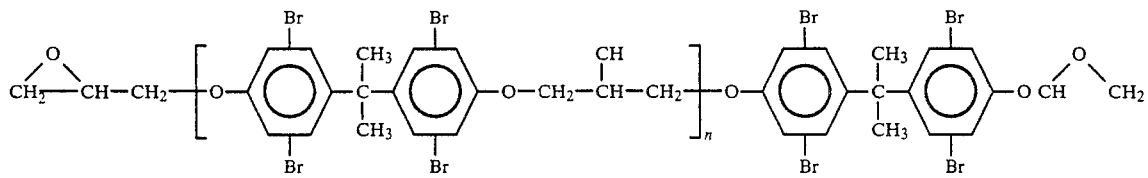

Wherein n is a positive integer, and the equivalent weight of the epoxy is 300-800.

(2) The bismaleimide of this invention may have the formula:

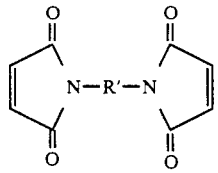

Wherein R' may be an aromatic group or an aliphatic group or an alicyclic group.

(3) The barbituric acid or its derivatives of this invention may have the formula:

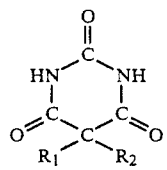

Wherein R1 and R2 are hydrogen or alkyl groups, such as —H, —CH3, —C6H5, —CH(CH3)2, —CH2CH(CH3)2, —CH2CH2CH(CH3)2, and

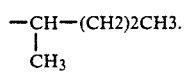

(4) A curing agent such as diamine of the formula:

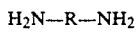

Wherein R is an aromatic, aliphatic or cycloaliphatic group.

The manufacturing procedure of this invention may be divided into three steps:

Step I: Add suitable amount of barbituric acid or its derivative in bismaleimide resin. The molar ratio of bismaleimide and barbituric acid or its derivative should be 1.3-2.2. After adding suitable solvent or solvent system and mixing completely, the mixture should be heated to and kept at 120°-145° C. for 0.5-1.5 hours.

Step II: Add epoxy resin in the bismaleimide resin mixture and mix it completely. The molar ratio of epoxy resin and bismaleimide should be 2.0-3.5 The mixture should be agitated at 70°-125° C. for 0.5-1.5 hours.

Step III: Add curing agent in the resin system. The molar ratio of epoxy resin and curing agent should be 1.0-1.2 The resin mixture should be agitated at 50°-65° C. for 0.5-1.5 hours.

In fact, the resin composition prepared from the above procedure will effectively increase the glass transition temperature of final products. However, if the barbituric acid or its derivative is not added or some other additive is employed to replace barbituric acid or its derivatives, the glass transition temperature will be reduced.

It has been obviously proven that the addition of barbituric acid or its derivatives can effectively increase the heat resistance and toughness of the resin composition. Meanwhile, owing to good compatibility of barbituric acid or its derivatives with epoxy resin and bismaleimides, the resin composition would not result in any phase separation.

For better understanding of the present invention, the following examples will be given to illustrate the preparation and effectiveness of the high-performance resin composition. However, the range of this invention must not be limited by the examples.

EXAMPLE 1

10.2 g of N,N'-4,4'-diphenylmethane-bismaleimide is dissolved in 40 ml of N-methyl-2-pyrrolidone, and then 1.79 g of barbituric acid is added. The mixture is heated and stirred at 130° C. for 1 hour. Subsequently, 31 g of epoxy resin (Dow 331) is heated to 130° C. and added to the aforesaid mixture. After continuous mixing and heating at 130° C. for 1 hour, the temperature is then reduced to 60° C. Finally, 10 g of diamino-diphenyl sulfone (DDS) is dissolved into a solvent system containing 20 ml of acetone and 20 ml of methyl ethyl ketone, and added to the above resin mixture. After stirring at 60° C. for 30 minutes, a high-performance resin composition according to this invention is obtained.

The glass transition temperature of the product obtained by the above procedure was determined to be 223° C. by tortional braid analysis (TBA).

The resin thus obtained is used to impregnate 7,628 fiberglass sheets to produce B-stage prepreg. Thereafter, 8 pieces of the prepreg, together with a 1 ounce copper sheet, are hot pressed at 180° C. and 350 psi for 60 minutes to form a copper laminate 1.6 mm in thickness. The peel strength between the resin-impregnated fiberglass sheet and the copper layer is 1.5 kg/cm. The drilling property is very good because little scrap is formed during drilling operation.

The above copper laminate is then etched to remove the copper layer. Via 90 degree bending for several times, the laminate is determined by a microscope to observe the adhesion between resin and fiberglass sheet. The observation shows that the adhesion between resin and fiberglass sheet is very good. Hence, the resin composition would provide good toughness for the products.

EXAMPLE

According to the preparation of this invention, 10.2 g of N,N'-4,4'-diphenylmethane-bis-maleimide is dissolved in 10 ml of N-methyl-2-pyrrolidone. Then 1.79 g of barbituric acid is added. And the mixture is heated and stirred at 130° C. for 1 hour. Subsequently, 31 g of epoxy resin (Dow 331) is heated to 130° C. and added to the aforesaid mixture. After continuous mixing and heating at 130° C. for 1 hour, the temperature is then reduced to 60° C. Finally, 1.976 g of dicyandiamide dissolved in 40 ml of 2-methoxy ethanol, is added to the above resin mixture, and stirred at 60° C. for 30 minutes.

The glass transition temperature of the resin composition thus obtained is determined to be 180° C. by tortional braid analysis (TBA). Through the same test procedure as Example 1, the resin composition is proven having good peel strength between copper layer and fiberglass sheet. It also shows to provide good toughness, and drilling property for the final product.

COMPARATIVE EXAMPLE 1

A resin composition is made according to the procedure of this invention. The glass transition temperature of said composition is determined, and compared with those of the resins in which the barbituric acid was neglected or reduced. The result is shown in Table 1, which shows that the glass transition temperature would increase if barbituric acid or its derivative is added. Meanwhile, various kinds of curing agents are also used for the composition.

COMPARATIVE EXAMPLE 2

According to the procedure of this invention, a resin composition is prepared. Meanwhile, various kinds of chemicals are employed to replace barbituric acid or its derivatives for the composition. The result is shown in Table 2, it shows that the glass transition temperature would reduce if the barbituric acid or its derivatives are replaced by other additives.

TABLE 1

| Comparison of Tg when the barbituric acid was added or not. | | | |
|---|---|---|---|
| BMI/EPOXY | BMI/BTA | Dicyandiamide/diamine | Tg (°C.) |
| 1/3 | 1/0.5 | 3/0 | 180 |
| 1/3 | 1/0 | 3/0 | 170 |
| 1/3 | 1/0.5 | 0/3 (DDS) | 223 |
| 1/3 | 1/0 | 0/3 (DDS) | 220 |
| 1/3 | 1/0.5 | 0/3 (DDPE) | 155 |
| 1/3 | 1/0 | 0/3 (DDPE) | 140 |

Remarks
1. Unit: equivalent weight
2. BMI: Bismaleimide
3. BAT: Barbituric acid
4. DDS: 4,4'-diamino diphenyl sulfone
5. DDPE: 4,4'-diamino diphenyl ether

TABLE 2

| Comparison of Tg when the barbituric acid was replaced by other chemicals. | | | |
|---|---|---|---|
| BMI/Epoxy | BMI/Modifier | DDS | Tg (°C.) |
| 1/3 | 1/0.5 (DDPE) | 3 | 200 |
| 1/3 | 1/0.25 (DDPE) + 0.25 (TPE-Q) | 3 | 210 |
| 1/3 | 1/0.5 (TPE-Q) | 3 | 180 |
| 1/3 | 1/0.5 (DAS) | 3 | 200 |
| 1/3 | 1/0.5 (MBCH) | 3 | 195 |
| 1/3 | 1/0.5 (TPDH) | 3 | 190 |
| 1/3 | 1/0.5 (DAMT) | 3 | 200 |
| 1/3 | 1/0.5 (HZB) | 3 | 200 |
| 1/3 | 1/0.5 (BAT) | 3 | 223 |

Remarks
1. Unit: equivalent weight
2. BMI: Biamaleimide
3. DDS: 4,4'-diamine diphenyl sulfone
4. DDPE: 4,4'-diamino diphenyl ether
5. TPE-Q: 1.4-Bis(P-amino phenoxy) benzene
6. DAS: dianisidine
7. MBCH: 4,4'-methylene bis(cyclohexylamine)
8. TPDH: terephalic dihydrazide
9. DAMT: 2.4-diamino-6-methyl-S-triazine
10. HZB: hydrazo benzene
11. BTA: barbituric acid

We claim:

1. A composition consisting of epoxy resin, bismaleimide and barbituric acid prepared by:
   a) dissolving said bismaleimide in a suitable solvent or solvent system and adding a suitable amount of said barbituric acid or its derivative to form a mixture;
   b) heating and stirring said mixture of step a) at a temperature of 115°-145° C. for 0.5-1.5 hours in order to form a bismaleimide resin mixture;
   c) adding said epoxy resin to said resin mixture of step b) and agitating and heating to form a resin system, wherein the molar ratio of said epoxy resin to said bismaleimide is 2.0-3.5; and
   d) adding a curing agent to said resin system of step c) and mixing and heating to form said composition.

2. A resin composition according to claim 1, wherein said barbituric acid or its derivatives are of the formula:

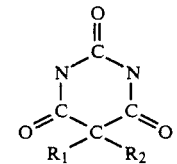

wherein $R_1$ and $R_2$ represent hydrogen, an alkyl group or phenyl.

3. A resin composition according to claim 1, wherein said bismaleimide is of the formula:

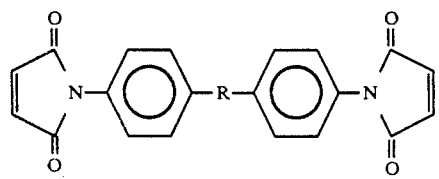

wherein R represents —$CH_2$— or —O—.

4. A resin composition according to claim 1, wherein said epoxy resin has the formula:

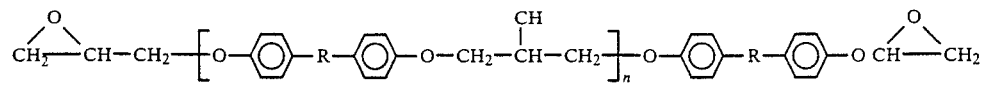
wherein R is an alkyl group having 1–4 carbon atoms, n is a positive integer, and the equivalent molar weight of said epoxy resin is 150–1000.
5. A resin composition according to claim 1, wherein said molar ratio of bismaleimide to barbituric acid or its derivatives is 1.3–2.2.
* * * * *